(12) United States Patent
Jung et al.

(10) Patent No.: US 10,283,279 B2
(45) Date of Patent: May 7, 2019

(54) PHOTOELECTRIC CONVERSION DEVICE

(71) Applicant: KABUSHIKI KAISHA TOSHIBA, Minato-ku (JP)

(72) Inventors: Hyangmi Jung, Yokohama (JP); Takeshi Gotanda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 54 days.

(21) Appl. No.: 15/439,496

(22) Filed: Feb. 22, 2017

(65) Prior Publication Data

US 2018/0075979 A1    Mar. 15, 2018

(30) Foreign Application Priority Data

Sep. 13, 2016  (JP) .................................. 2016-178505

(51) Int. Cl.
*H01G 9/20* (2006.01)
*H01L 51/00* (2006.01)
*H01L 51/42* (2006.01)

(52) U.S. Cl.
CPC ....... *H01G 9/2013* (2013.01); *H01L 51/0026* (2013.01); *H01L 51/0035* (2013.01);
(Continued)

(58) Field of Classification Search
CPC ............. H01G 9/2013; H01L 51/0003; H01L 51/0007; H01L 51/0035; H01L 51/0037;
(Continued)

(56) References Cited

U.S. PATENT DOCUMENTS

2009/0151787 A1    6/2009  Yoshikawa et al.
2010/0229949 A1*   9/2010  Yamamoto .......... H01G 9/2031
                                                136/261
(Continued)

FOREIGN PATENT DOCUMENTS

JP       2007-273939      10/2007
JP       4465812           5/2010
(Continued)

OTHER PUBLICATIONS

Notice of Allowance dated Jun. 20, 2017 in Japanese Patent Application No. 2016-178505.
(Continued)

*Primary Examiner* — Mayla Gonzalez Ramos
(74) *Attorney, Agent, or Firm* — Oblon, McClelland, Maier & Neustadt, L.L.P.

(57) ABSTRACT

A photoelectric conversion device of an embodiment includes, in sequence: a substrate; a first electrode; a photoelectric conversion layer containing a perovskite compound and a solvent; and a second electrode. The perovskite compound has a composition represented by a composition formula of $ABX_3$. The A represents at least one selected from a monovalent cation of a metal element and a monovalent cation of an amine compound. The B represents a bivalent cation of a metal element. The X represents a monovalent anion of a halogen element. The number of molecules of the solvent with respect to one crystal lattice of the perovskite compound ranges from 0.004 to 0.5.

10 Claims, 7 Drawing Sheets

(52) U.S. Cl.
CPC ...... *H01L 51/0037* (2013.01); *H01L 51/0077* (2013.01); *H01L 51/4206* (2013.01); *Y02E 10/549* (2013.01)

(58) Field of Classification Search
CPC ............. H01L 51/0077; H01L 51/4206; H01L 51/0026; Y02E 10/549
See application file for complete search history.

(56) References Cited

U.S. PATENT DOCUMENTS

| | | |
|---|---|---|
| 2011/0265877 A1 | 11/2011 | Yoshikawa et al. |
| 2015/0136232 A1 | 5/2015 | Snaith et al. |
| 2015/0228415 A1 | 8/2015 | Seok et al. |
| 2016/0322591 A1 | 11/2016 | Seok et al. |
| 2018/0019066 A1* | 1/2018 | Hayakawa ........... H01G 9/2009 |

FOREIGN PATENT DOCUMENTS

| | | |
|---|---|---|
| JP | 2012-243911 | 12/2012 |
| JP | 2015-517736 | 6/2015 |
| JP | 2015-185822 | 10/2015 |
| JP | 2015-529982 | 10/2015 |
| WO | WO 2015/099412 A1 | 7/2015 |
| WO | WO-2016121922 A1 * | 8/2016 |

OTHER PUBLICATIONS

Nam Joong Jeon, et al., "Solvent engineering for high-performance inorganic-organic hybrid perovskite solar cells", Nature Materials, vol. 13, 2014, pp. 897-903.

Yunlong Guo, et al., "Chemical Pathways Connecting Lead(II) Iodide and Perovskite via Polymeric Plumbate (II) Fiber", Journal of the American Chemical Society, 2015, 137, pp. 15907-15914.

* cited by examiner

PHOTOELECTRIC CONVERSION DEVICE

CROSS-REFERENCE TO RELATED APPLICATIONS

This application is based upon and claims the benefit of priority from Japanese Patent Application No. 2016-178505, filed on Sep. 13, 2016; the entire contents of which are incorporated herein by reference.

FIELD

Embodiments described herein relate generally to a photoelectric conversion device.

BACKGROUND

Photoelectric conversion devices (such as photovoltaics, a photosensor, a light emitting element, a photodiode, and an optical memory) including perovskite materials as a photoelectric conversion material are expected as a low-cost photoelectric conversion device because they can be manufactured using an inexpensive coating method for forming layers. Among the perovskite materials as the photoelectric conversion material, a perovskite crystal, having a composition represented by $ABX_3$ and a three-dimensional crystal structure, is excellent in power conversion efficiency, and therefore it is reported that photovoltaics including the perovskite crystal has enhanced conversion efficiency. Such photovoltaics desirably have large areas. In the photovoltaics using the perovskite crystal, a report describes the conversion efficiency of about 20% in the case of an element area of about 0.1 $cm^2$, but it also describes the conversion efficiency of about 15% in the case of the element area of 1 $cm^2$ and the conversion efficiency of about 10% in the case of the element area of 100 $cm^2$. This may result from the difficulty of forming a large, uniform, and high quality perovskite crystal layer using a conventional perovskite-layer forming technique.

A perovskite layer can be formed by the following method: a material constituting a perovskite compound is dissolved in a solvent enabling dissolution of the perovskite crystal to form a solution, this solution is applied on a film forming object such as a substrate, and thereafter the solvent is removed (dried) and the perovskite crystal is precipitated. However, in such a forming method, only a slight change in a film forming condition and a film forming environment causes large variations in film properties of a photoelectric conversion layer of the perovskite crystal. The film properties mean morphology, sizes and shapes of crystals, lattice defects, dislocation, and orientation displacement of crystals, coverage, film thickness, and the like. Due to such an easy variation in the film properties of a perovskite crystal layer, a large, uniform, and high quality photoelectric conversion layer is not easily formed with the conventional forming method. Therefore, it is not easy to obtain a practical photoelectric conversion device having a large area and high power conversion efficiency, with good reproducibility.

DETAILED DESCRIPTION

A photoelectric conversion device of an embodiment includes, in sequence: a substrate; a first electrode; a photoelectric conversion layer containing a perovskite compound and a solvent; and a second electrode. The perovskite compound has a composition represented by a composition formula of $ABX_3$. The A represents at least one selected from a monovalent cation of a metal element and a monovalent cation of an amine compound. The B represents a bivalent cation of a metal element. The X represents a monovalent anion of a halogen element. The number of molecules of the solvent with respect to one crystal lattice of the perovskite compound ranges from 0.004 to 0.5.

Hereinafter, a photoelectric conversion device of an embodiment and a producing method thereof will be explained with reference to the drawings. Note that, in each embodiment, substantially the same constituent parts are denoted by the same reference signs and an explanation thereof will be partly omitted in some cases. The drawings are schematic, and a relation of thickness and planer dimension, a thickness ratio among parts, and so on are sometimes different from actual ones. Terms indicating up and down directions and so on in the explanation are sometimes different from actual directions based on a gravitational acceleration direction. In the following, the embodiment in which the photoelectric conversion device is applied to a photovoltaic module will be mainly described. However, the photoelectric conversion device of the embodiment is not limited to this. The photoelectric conversion device of the embodiment is applicable to a photosensor, a light emitting element, a photodiode, an optical memory, and the like besides photovoltaics.

Figure 1:
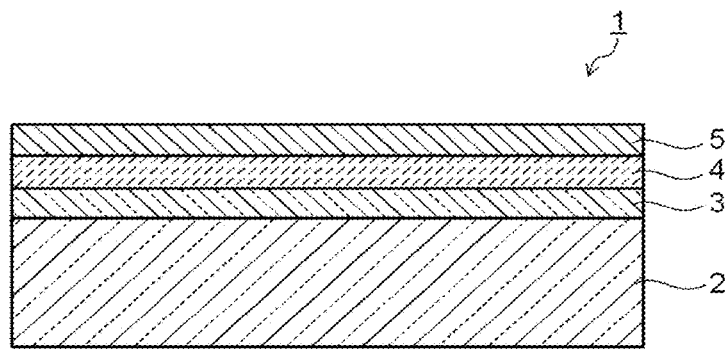
FIG. 1 is a sectional view illustrating one example of a photoelectric conversion device of an embodiment.
Figure 2:
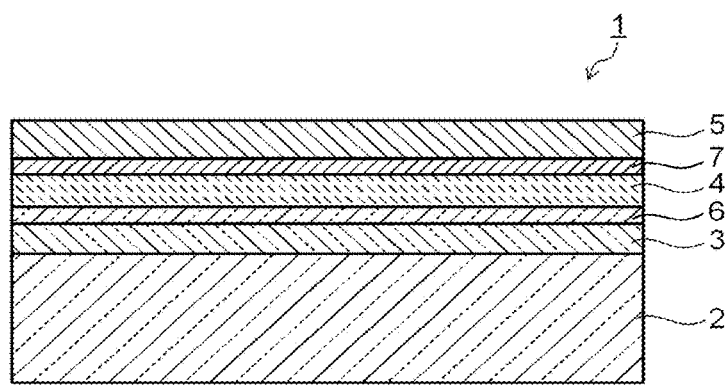
FIG. 2 is a sectional view illustrating another example of a photoelectric conversion device of the embodiment.

FIG. 1 illustrates a configuration of the photoelectric conversion device of the embodiment. A photoelectric conversion device 1 illustrated in FIG. 1 includes: a substrate 2; a first electrode 3 provided on the substrate 2; a photoelectric conversion layer 4 provided on the first electrode 3; and a second electrode 5 provided on the photoelectric conversion layer 4. The photoelectric conversion device 1 of the embodiment may have a first intermediate layer 6 provided between the first electrode 3 and the photoelectric conversion layer 4 and a second intermediate layer 7 provided between the photoelectric conversion layer 4 and the second electrode 5 as illustrated in FIG. 2. As the first and second intermediate layers 6, 7, a hole transport layer, an electron transport layer, and so on are used.

The photoelectric conversion layer 4 contains a perovskite compound having a composition represented by the following formula (1), and further contains a good solvent of the perovskite compound in a range of 0.004 or more to 0.5 or less in the number of molecules with respect to one crystal lattice of the perovskite compound.

Composition formula: ABX$_3$ (1)

In the formula (1), A represents at least one selected from a monovalent cation of a metal element and a monovalent cation of an amine compound, B represents a divalent cation of a metal element, and X represents a monovalent anion of a halogen element.

A perovskite-type crystal structure is classified into four types of zero-dimensional structure to three-dimensional structure. The two-dimensional structure having a composition represented by $A_2BX_4$ and the three-dimensional structure having a composition represented by $ABX_3$ are advantageous for obtaining a high-efficiency photoelectric conversion material and a photoelectric conversion device using it. Between the both, the three-dimensional structure has been known that a bound energy of an exciton is low, which is more preferable for obtaining the high-efficiency photoelectric conversion material and the photoelectric conversion device. It has been known that an A site having a large ion radius tends to take the two-dimensional structure, and an A site having a small ion radius tends to take the three-dimensional structure. Note that a ratio of each of the ions constituting the perovskite compound may exhibit a photoelectric conversion function even though it does not correspond with a ratio of the formula (1) perfectly, and when a ratio of an A-site ion is set to 1, a ratio of a B-site ion may be on the order of 0.5 to 1.2 and a ratio of an X-site ion may be on the order of 2.0 to 3.4.

For the purpose of satisfying such an A-site ion condition as described above, the monovalent cation forming the A site is preferably at least one selected from $Cs^+$, $Rb^+$, $K^+$, $CH_3NH_3^+$, $C_2H_5NH_3^+$, $C_3H_7NH_3^+$, $C_4H_9NH_3^+$, $HC(NH_2)_2^+$, and $C(NH_2)_3^+$, and further more preferably contains at least the monovalent cation of the amine compound containing $NH_2$ or $NH_3$. Similarly, the divalent cation forming the B site is preferably at least one selected from $Pb^{2+}$, $Sn^{2+}$, and $Ge^{2+}$, and the monovalent anion forming the X site is preferably at least one selected from $F^-$, $Cl^-$, $Br^-$, and $I^-$. These make it possible to enhance power conversion efficiency of the photoelectric conversion layer 4 containing the perovskite compound (perovskite crystal).

The photoelectric conversion layer 4 containing the perovskite compound having the composition represented by the formula (1) is formed by, for example, forming a solution by dissolving the perovskite compound or a precursor thereof in the good solvent of the perovskite compound, and applying this solution on the substrate 2 having, for example, the first electrode 3 or the first electrode 3 and the first intermediate layer 6, and thereafter removing (drying) part of the good solvent and precipitating the perovskite crystal. At this time, in a layer (perovskite crystal layer/photoelectric conversion layer 4) formed by precipitating the perovskite crystal, part of the good solvent used for forming the solution is made to remain. A volume of the good solvent in the perovskite crystal layer is controlled in the range of 0.004 or more to 0.5 or less in the number of molecules (1 mole) of the good solvent, in other words, in the range of 0.004 to 0.5 mole/mole with respect to one crystal lattice (1 mole) of the perovskite compound.

Existence of the good solvent with such a volume as described above in the perovskite crystal layer (photoelectric conversion layer 4) improves a free-movement characteristic of the perovskite crystal or ions and molecular ions constituting part of the crystal, or the like in the layer. This allows an increase in film properties of the perovskite crystal layer even when an area of the photoelectric conversion layer 4 is enlarged, for example, an enlargement is performed so that the area thereof is 1 cm$^2$ or more, further 10 cm$^2$ or more, and further 100 cm$^2$ or more. Specifically, it is possible to improve surface flatness and film thickness uniformity of the perovskite crystal layer, or the like, and it is possible to suppress occurrence of lattice defects, dislocation, orientation displacement, and the like of the crystal, coarsening of a crystal grain size, or the like, thereby allowing an increase in a quality of the perovskite crystal itself. Further, it is also possible to improve robustness of the perovskite crystal layer. These make it possible to form a large, uniform, and high quality photoelectric conversion layer 4, and obtain the photoelectric conversion device 1 having a large area and high power conversion efficiency, with good reproducibility.

Setting the number of molecules of the good solvent in the photoelectric conversion layer 4 to 0.004 or more with respect to one crystal lattice of the perovskite compound makes it possible to enhance such a free-movement characteristic of the perovskite crystal, constituent ions thereof, or the like as described above, thereby allowing enhancing of the film properties, durability, and the like of the perovskite crystal layer. The number of molecules of the good solvent is more preferably 0.02 or more and further preferably 0.1 or more with respect to one crystal lattice of the perovskite compound. However, when the number of molecules of the good solvent exceeds 0.5 with respect to one crystal lattice of the perovskite compound, a crystal structure of the perovskite compound is not easily formed, resulting in failing to sufficiently exhibit the photoelectric conversion function of the photoelectric conversion layer 4. The number of molecules of the good solvent is preferably 0.35 or less with respect to one crystal lattice of the perovskite compound.

The perovskite compound constituting the photoelectric conversion layer 4 preferably has a particle shape in which an average major axis diameter is 300 nm or less. This makes it possible to form a flat and high quality perovskite crystal layer over a large area. Moreover, in an X-ray diffraction (XRD) pattern of the perovskite compound constituting the photoelectric conversion layer 4, a peak preferably exists near 9.5°. Further, a shoulder peak preferably exists on a low angle side of a peak near 14° which is derived from the perovskite crystal. It is considered that such a peak is not only derived from the perovskite crystal but also occurs due to action caused by coordinate bonding between the perovskite crystal and the good solvent (since molecules of the good solvent exist in crystal lattices of the perovskite compound, coordinate bonding is formed between the molecules of a perovskite crystal lattice and the molecules of the good solvent in the lattice). When such a peak exists, it is possible to further enhance a characteristic of the photoelectric conversion layer 4 made up of the perovskite crystal layer.

A film thickness of the photoelectric conversion layer 4 is not particularly limited, but is preferably 30 to 1000 nm. Too large film thickness of the photoelectric conversion layer 4 increases a light absorption amount to increase short-circuit current density (Jsc), but a loss due to deactivation tends to increase as much as a carrier transportation distance increases. In order to enhance efficiency of the photoelectric conversion layer 4, the film thickness of the photoelectric conversion layer 4 is preferably 1000 nm or less and more preferably 700 nm or less. Further, because too small film thickness of the photoelectric conversion layer 4 also decreases the efficiency and a power generation amount, the film thickness of the photoelectric conversion layer 4 is preferably 30 nm or more and more preferably 60 nm or more.

The photoelectric conversion layer 4 is formed by, applying a perovskite material solution (coating solution) formed by dissolving the perovskite compound or the precursor thereof in the good solvent on the substrate 2, and thereafter removing part of the good solvent by drying and precipitating the perovskite crystal as described above. A coating method of the perovskite material solution is not particularly limited, and various coating methods are applicable such as a spin coating method, a gravure coating method, a slit coating method, a bar coating method, a dip method, a die coating method, a spray method, and a printing method. Further, the coating solution may be changed into a vapor state and be applied. When the precursor of the perovskite compound is used, a solution can be used in which a plurality of materials constituting the perovskite compound are dissolved individually in the good solvent or in which the plurality of materials are dissolved in one good solvent. The perovskite material solution may contain further an additive. Such an additive includes a surfactant, a charge impairing agent, 1,8-diiodooctane, and N-cyclohexyl-2-pyrrolidone.

In the above-described forming process of the photoelectric conversion layer 4, an existing volume of the good solvent of the perovskite compound in the photoelectric conversion layer 4 can be controlled by adjusting a removed volume of the good solvent. For example, as described in detail in examples, when the perovskite material solution is applied on the substrate 2, the substrate 2 on which the perovskite material solution is applied is subjected to an annealing process after drying part of the solvent by blowing nitrogen or the like. The existing volume of the good solvent can be controlled by adjusting a process temperature and a process time of the annealing. Specifically, the process temperature of the annealing is preferably set to less than 100° C. and more preferably set to 70° C. or less. The process time of the annealing is different depending on the process temperature, but is preferably set to 60 minutes or less and more preferably set to 30 minutes or less. The process time is preferably set to three minutes or more, although depending on a residual volume of the good solvent. However, the existing volume of the good solvent in the photoelectric conversion layer 4 can also be controlled by only a drying process at a time of applying the material solution without performing the annealing process in some cases. Further, the existing volume of the good solvent in the photoelectric conversion layer 4 can also be controlled by reducing a pressure of a drying process environment at a time of applying the material solution or an ambient environment after the drying process without performing the annealing process in some cases.

As described above, the good solvent of the perovskite compound is made to remain in the photoelectric conversion layer 4 by controlling a drying condition or an annealing condition of the perovskite material solution, but control of a good solvent volume in the photoelectric conversion layer 4 is not limited to this. The good solvent of the perovskite compound may be made to exist in the photoelectric conversion layer 4 by exposing the perovskite crystal layer formed on the substrate 2 to vapor of the good solvent, or the like. Here, as the good solvent of the perovskite compound, under the environments of solid content concentration, temperature, pressure, and the like in a film forming process of the perovskite crystal layer, a solvent enabling dissolution of the perovskite crystal and a precursor thereof is applicable, but, for example, solubility at 25° C. is preferably 15 g/100 g or more.

The good solvent of the perovskite compound includes: an ester-based solvent such as methyl formate, ethyl formate, propyl formate, pentyl formate, methyl acetate, ethyl acetate, or pentyl acetate; a ketone-based solvent such as γ-butyrolactone, N-methyl-2-pyrrolidone, dimethyl ketone, diisobutyl ketone, cyclopentanone, cyclohexanone, or methylcyclohexanone; an ether-based solvent such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, or phenetole; an alcohol-based solvent having four or more carbons, such as butanol, pentanol, methoxypropanol, diacetone alcohol, or cyclohexanol; a halogenated alcohol-based solvent (alcohol in which halogen is substituted for at least part of hydrogen) such as 2-fluoroethanol, 2,2,2-trifluoroethanol, or 2,2,3,3-tetrafluoro-1-propanol; a glycol ether-based solvent such as ethylene glycol monomethyl ether, ethylene glycol monoethyl ether, ethylene glycol monobutyl ether, ethylene glycol monoethyl ether acetate, or triethylene glycol dimethyl ether; an amide-based solvent such as formamide, N,N-dimethyl formamide, diformamide, acetamide, or N,N-dimethyl acetamide; a nitrile-based solvent such as acetonitrile, isobutyronitrile, propionitrile, or methoxyacetonitrile; a carbonate-based solvent such as ethylene carbonate or propylene carbonate; a halogenated hydrocarbon (hydrocarbon in which halogen is substituted for at least part of hydrogen) such as methylene chloride, dichloromethane, or chloroform; a hydrocarbon having five or more carbons, such as n-pentane, cyclohexane, n-hexane, benzene, toluene, or xylene; or a sulfoxide-based solvent such as dimethyl sulfoxide or diethyl sulfoxide. A structure of these organic solvents may be any of a straight-chain structure, a branched structure, and a cyclic structure. The esters, the ketones, the ethers, and the alcohols may have any two or more of their functional groups (—COO—, —CO—, —O—, —OH). A halogen atom (in particular, a fluorine atom) may be substituted for a hydrogen atom in a hydrocarbon portion of the esters, the ketones, and the ethers. The organic solvents may be used alone or in a mixture of two or more thereof.

The organic solvent which is used as the good solvent of the perovskite compound is preferably an amide-based solvent having an amide structure represented by the following formula (2).

General formula: $R1-C(=O)-NR2R3$ (2)

In the formula (2), each of the R1, R2, and R3 represents a monovalent group independently selected from hydrogen, halogen such as fluorine, chlorine, bromine, or iodine, a nitro group, a cyano group, an amino group, a substituted or unsubstituted alkyl group, a substituted or unsubstituted alkoxy group, a substituted or unsubstituted alkanoyl group, a substituted or unsubstituted aryl group, and a substituted or unsubstituted heteroaryl group.

In the monovalent group constituting the R1 group, the R2 group, or the R3 group, the number of carbons of the substituted or unsubstituted alkyl group preferably falls within a range of 1 to 30. The substituted or unsubstituted alkyl group may be any of a straight-chain form, a branched-chain form, and a cyclic form. Examples of such an alkyl group includes a methyl group, an ethyl group, a propyl group, an isopropyl group, a butyl group, a pentyl group, a hexyl group, an octyl group, an isooctyl group, a 2-ethylhexyl group, a nonyl group, a decyl group, a dodecyl group, an octadecyl group, a 2-hexadecyl group, an octadodecyl group, a trifluoromethyl group, a pentafluoroethyl group, a perfluorohexyl group, a perfluorooctyl group, and the like, but the alkyl group is not limited to these.

The number of carbons of the substituted or unsubstituted alkoxy group (—ORx) preferably falls within a range of 1 to 30. The substituted or unsubstituted alkoxy group may be any of a straight-chain form, a branched-chain form, and a cyclic form. Examples of the substituted or unsubstituted alkoxy group includes a methoxy group, an ethoxy group, a propoxy group, a butoxy group, a hexyloxy group, an octyloxy group, a 2-ethylhexyloxy group, and the like, but the substituted or unsubstituted alkoxy group is not limited to these. An Rx group in the alkoxy group is not limited to an alkyl group, and may be an aromatic group, a heterocyclic group, or the like.

The number of carbons of the substituted or unsubstituted alkanoyl group (—C(=O)Ry) preferably falls within a range of 1 to 30. The substituted or unsubstituted alkanoyl group may be any of a straight-chain form, a branched-chain form, and a cyclic form. Examples of the substituted or unsubstituted alkanoyl group includes an acetyl group, a propanoyl group, a butanoyl group, a pentanoyl group, a hexanoyl group, an octanoly group, a 2-ethylhexanoyl group, a nonanoyl group, a decanoyl group, a dodecanoyl group, an octadecanoyl group, a 2-hexadecanoyl group, an octadodecyl group, a trifluoroacetyl group, a pentafluoropropanoyl group, a perfluorohexanoyl group, a perfluorooctanoyl group, and the like, but the substituted or unsubstituted alkanoyl group is not limited to these. An Ry group in the alkanoyl group is not limited to an alkyl group, and may be an aromatic group, a heterocyclic group, or the like.

The number of carbons of the substituted or unsubstituted aryl group and heteroaryl group preferably falls within a range of 4 to 20. Examples of the substituted or unsubstituted aryl group and heteroaryl group includes a phenyl group, a naphthyl group, a 4-biphenyl group, a 2-thienyl group, a 2-furanyl group, a 4-tolyl group, a 4-octylphenyl group, a 4-(2-ethylhexyl)biphenyl group, a 2-(2-ehylhexyl)thienyl group, a 2-(5-ethylhexyl)furanyl group, and the like, but the substituted or unsubstituted aryl group and heteroaryl group are not limited to these.

Such amide-based solvents as described above can exist stably in the perovskite compound or between the perovskite compounds because they have high solubility for perovskite or a material constituting it, or nitrogen of an amide group (—C(=O)—NR—) has a plus charge. Accordingly, when the good solvent of the perovskite compound is made to exist in the photoelectric conversion layer 4, it is possible to stabilize an existence state of the good solvent and the existing volume thereof. Examples of the amide-based solvent includes formamide, N,N-dimethyl formamide, diformamide, acetamide, N,N-dimethyl acetamide, and the like as described above, but the amide-based solvent is not limited to these.

Light such as sunlight and illumination light is emitted to the photoelectric conversion layer 4 from the substrate 2 side, for example. In this case, a transparent substrate is used for the substrate 2, and a transparent electrode is used for the first electrode 3. When the photoelectric conversion layer 4 made up of the perovskite crystal layer absorbs light emitted to the photoelectric conversion device 1, an electron and its paired hole are generated. Out of generated electrons and holes, for example, the holes are collected in the transparent electrode (first electrode) 3 via the hole transport layer as the first intermediate layer 6, and the electrons are collected in the counter electrode (second electrode) 5 via the electron transport layer as the second intermediate layer 7. The electrodes of collecting the holes and the electrons may be an opposite of each other. Further, an emission direction of the light to the photoelectric conversion layer 4 may be opposite to the direction from the substrate 2 side. That is, light may by emitted to the photoelectric conversion layer 4 from the second electrode 5 side. In this case, the transparent electrode is used for the second electrode 5. Hereinafter, components of the photoelectric conversion device 1 other than the photoelectric conversion layer 4 will be described.

The substrate 2 supports other components and is preferably formed of an insulating material having strength, heat resistance, and the like, which allow formation of an electrode on a surface thereof. Therefore, the substrate 2 which does not change in quality due to heat exerted at a time of forming the electrode and the organic solvent making contact therewith is preferably used. As a constituent material of the substrate 2, a glass material such as non-alkali glass, quarts glass, or sapphire, a polymer material such as polyethylene (PE), polyethylene terephthalate (PET), polyethylene naphthalate (PEN), polyimide, polyamide, polyamide-imide, a cycloolefin polymer, or a liquid crystal polymer, or the like is used. Further in some cases, a metal material such as stainless steel (SUS) or a semiconductor material such as silicon may be used.

The substrate 2 may be a rigid substrate formed of an inorganic material or an organic material, or may be a flexible substrate formed of an organic material or a very thin inorganic material. The substrate 2 may be transparent or may be opaque, and is selected depending on a structure of the required photoelectric conversion device 1. When light is emitted to the photoelectric conversion layer 4 from the substrate 2 side, the substrate 2 having a light transmitting property is used. Further, when the second electrode 5 on opposite side to the substrate 2 is transparent or translucent and light is emitted to the photoelectric conversion layer 4 from the second electrode 5 side, the opaque substrate 2 can be used. It is preferred that strength which allows support of other components is even obtained as a thickness of the substrate 2, which is not particularly limited.

When the substrate 2 is disposed on a light incident surface side, an anti-reflection film having a moth-eye structure can be provided on a light incident surface of the substrate 2, for example. Such a structure makes it possible to take in light efficiently and improve energy conversion efficiency of the photoelectric conversion device 1. The moth-eye structure has a structure in which regular projections of about 100 nm are arranged on a surface, and a refractive index in a thickness direction is changed continuously by this projection structure. This does not make a discontinuously changing surface of the refractive index, which occurs by making an anti-reflective film act as an intermediary, to exist, thereby decreasing light reflection and allowing improvement in the energy conversion efficiency of the photoelectric conversion device 1.

Various publicly known materials having conductivity can be applied to the first electrode 3 and the second electrode 5. However, a material and a structure which are transparent or translucent, and have the conductivity are applied to the electrode on the light incident surface side. The transparent or translucent electrode material includes a conductive and light-transmissive metal oxide film, and a translucent metal thin film. To the first electrode 3 and the second electrode 5, a structure in which a plurality of materials are laminated on one of the electrodes or on both thereof may be applied.

The transparent or translucent electrode material having the conductivity includes a conductive oxide material such as indium oxide, zinc oxide, tin oxide, indium tin oxide (ITO), fluorine-doped tin oxide (FTO), indium-zinc oxide (IZO), indium-gallium-zinc oxide (IGZO), or a film (for example, NESA) formed using conductive glass such as the indium-zinc oxide, a metal material such as metal such as gold, platinum, silver, copper, titanium, zirconium, cobalt, nickel, indium, or aluminum, or an alloy containing at least one of the above metals, and a conductive polymer material such as poly(3,4-ethylenedioxythiophene)/poly(4-styrene-sulfonate) (PEDOT/PSS). As the transparent or translucent electrode, in particular, ITO or FTO is preferably used.

Thicknesses of the electrodes 3, 5 are preferably each 30 to 300 nm when the electrode material is the conductive oxide such as ITO or FTO. When the thickness of the electrodes is smaller than 30 nm, there is a tendency for the conductivity to decrease and for resistance to increase. When the resistance increases, there is a possibility of becoming a decrease factor of the power conversion efficiency. When the thickness of the electrodes is larger than 300 nm, flexibility of an ITO film, a FTO film, or the like tends to decrease. As a result, when a film thickness is large, action of stress sometimes causes a crack. Sheet resistance of the electrodes is preferably as low as possible, and is preferably 15Ω/□ or less. The electrodes may be a single-layer structure, or may be a multi-layered structure in which layers constituted of materials having different work functions are laminated. The electrode for which these materials are used is formed by, for example, a vacuum deposition method, a sputtering method, an ion plating method, a sol gel method, a coating method, a plating method, or the like.

Examples of an opaque electrode material includes a metal material such as metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, or an alloy containing at least one of the above metals, and a carbon material such as graphene or a carbon nanotube. The electrode for which these materials are used is formed by, for example, the vacuum deposition method, the sputtering method, the ion plating method, the sol gel method, the coating method, the plating method, or the like.

The film thickness of the electrodes is preferably 1 to 500 nm, and more preferably 10 to 300 nm. When the film thickness is smaller than the above-described range, the resistance becomes too large and a generated electric charge cannot sometimes be sufficiently conveyed to an external circuit. When the film thickness is large, a material temperature rises because a long time is required of film formation of the electrodes, thereby sometimes causing damage to other materials and causing performance to deteriorate. Moreover, because the material is used in large quantity, an occupied time of a film forming apparatus becomes long, thereby sometimes causing an increase in costs.

As the electrode material, an organic material can also be used. For example, a conductive polymer such as polyethylene dioxythiophene (PEDOT) may be used. Example of such a conductive polymer is put on the market includes Clevios P H 500, Clevios P H, Clevios P VP Al 4083, and Clevios HIL 1, 1 (any of them is a product name, made by Starck Inc.). The work function of PEDOT (or ionization potential) is 4.4 eV, but the work function of the electrode can be adjusted by combining another material with PEDOT. For example, the work function can be adjusted in a range of 5.0 to 5.8 eV by mixing polystyrenesulfonate (PSS) into PEDOT.

However, in a layer made up of a material in which another material is combined with the conductive polymer, a ratio of the conductive polymer decreases relatively, and thereby there is a possibility that a carrier transportation property decreases. Therefore, the film thickness is preferably smaller than 50 nm, and more preferably 15 nm or less. Further, when the ratio of the conductive polymer decreases relatively, a coating solution of a perovskite layer is easily repelled by an effect of surface energy, and thereby a pinhole and the like sometimes easily occur on the perovskite layer. With respect to such a point, blowing nitrogen or the like makes it possible to complete drying of the solvent before the coating solution is repelled. As the conductive polymer, polypyrrole, polythiophene, polyaniline, or the like is preferably used.

As the first intermediate layer 6 and the second intermediate layer 7, for example, the hole transport layer and the electron transport layer are applied. In this case, one intermediate layer (for example, the first intermediate layer 6) functions as the hole transport layer, and the other intermediate layer (for example, the second intermediate layer 7) functions as the electron transport layer. In order to further enhance conversion efficiency of the photoelectric conversion device 1, the hole transport layer and the electron transport layer are preferably applied. However, these layers are not an essential configuration, and it is unnecessary to include either of the hole transport layer and the electron transport layer or both of them. Both of the first and second intermediate layers 6, 7 or either of them may have a structure in which different materials are laminated.

The electron transport layer has a function of efficiently transporting electrons. When either of the intermediate layers 6, 7 is made to function as the electron transport layer, this layer can contain at least one of a halogen compound, a metal oxide, and an n-type organic semiconductor. As the halogen compound, LiF, LiCl, LiBr, LiI, NaF, NaCl, NaBr, NaL KF, KCl, KBr, KI, CsF, or the like is preferably used. Among them, LiF is particularly preferred. As the metal oxide, a single oxide such as titanium oxide, molybdenum oxide, vanadium oxide, zinc oxide, nickel oxide, lithium oxide, calcium oxide, cesium oxide, aluminum oxide, or niobium oxide, or a mixture thereof is used. Among them, titanium oxide is preferred. As titanium oxide, amorphous titanium oxide obtained by hydrolyzing titanium alkoxide by a sol-gel method is preferred. As the electron transport layer, an inorganic material of metal calcium or the like can also be used.

As the n-type organic semiconductor, fullerene and a derivative thereof are preferred but are not particularly limited. Specifically, they include the fullerene having a basic structure of $C_{60}$, $C_{70}$, $C_{76}$, $C_{78}$, and $C_{84}$, and the derivative thereof. In the fullerene derivative, carbon atoms in a fullerene structure may be modified by optional functional groups, and these functional groups may be bonded to each other to form a ring. The fullerene derivative contains a fullerene-bonded polymer. The fullerene derivative which has a functional group having a high affinity for the solvent and has high solubility to the solvent is preferred.

Examples of the functional group in the fullerene derivative include a hydrogen atom, a hydroxyl group, a halogen atom such as a fluorine atom or a chlorine atom, an alkyl group such as a methyl group or an ethyl group, an alkenyl group such as a vinyl group, a cyano group, an alkoxy group such as a methoxy group or an ethoxy group, an aromatic hydrocarbon group such as a phenyl group or a naphthyl group, and an aromatic heterocyclic group such as a thienyl group or a pyridyl group. Specifically, they include hydrogenated fullerene such as $C_{60}H_{36}$ or $C_{70}H_{36}$, and oxide fullerene such as $C_{60}$ or $C_{70}$, a fullerene metal complex. As the fullerene derivative, it is more preferable to use [6,6]-phenyl-$C_{61}$-butyric acid methyl ester PCBM) or [6,6]-phenyl-$C_{71}$-butyric acid methyl ester (PCBM).

As the n-type organic semiconductor, a low-molecular-weight compound which can be deposited by vapor deposition can be used. The low-molecular-weight compound mentioned here has number average molecular weight Mn and weight-average molecular weight Mw corresponding to each other, and either of them being 10000 or less. BCP (bathocuproine), Bphen (4,7-diphenyl-1,10-phenanthroline), TpPyPB (1,3,5-tri(p-pyrid-3-yl-phenyl)benzene), and DPP S (diphenyl bis(4-pyridin-3-yl)phenyl)silane) are more preferable.

When the electron transport layer is provided in the photoelectric conversion device 1, a thickness of the electron transport layer is preferably 100 nm or less. This makes it possible to decrease film resistance of the electron transport layer and enhance the conversion efficiency. Meanwhile, the thickness of the electron transport layer can be set to 5 nm or more. Providing the electron transport layer and setting it to over a certain thickness make it possible to exhibit a hole blocking effect sufficiently and prevent deactivation of generated excitons before they emit electrons and holes. As a result, it is possible to efficiently take out an electric current.

The hole transport layer has a function of efficiently transporting holes. When the other of the intermediate layers 6, 7 is made to function as the hole transport layer, this layer can contain a p-type organic semiconductor or the metal oxide.

As a material of the hole transport layer, the p-type organic semiconductor can be used. The p-type organic semiconductor preferably contains, for example, a copolymer made up of a donor unit and an acceptor unit. As the donor unit, fluorene, thiophene, or the like can be used. As the acceptor unit, benzothiadiazole or the like can be used. Specifically, there can be used polythiophene and a derivative thereof, polypyrrole and a derivative thereof, a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine in a side chain or a main chain, polyaniline and a derivative thereof, a phthalocyanine derivative, porphyrin and a derivative thereof, polyphenylene vinylene and a derivative thereof, polythienylene vinylene and a derivative thereof, a benzodithiophene derivative, a thieno[3,2-b]thiophene derivative, or the like. As the hole transport layer, these materials may be used in combination, or the copolymer made up of monomers constituting these materials may be used. Among these materials, polythiophene and a derivative thereof are preferred because they have excellent stereoregularity and also have relatively high solubility to the solvent.

As the material of the hole transport layer besides them, a derivative of poly[N-9'-heptadecanyl-2,7-carbazole-alt-5, 5-(4',7'-di-2-thienyl-2',1',3'-benzothiadiazole)] (PCDTBT) which is a copolymer containing carbazole, benzothiadiazol, and thiophene or the like may be used. Moreover, a copolymer of the benzodithiophene (BDT) derivative and the thieno[3,2-b]thiophene derivative is also preferred. For example, poly[[4,8-bis[(2-ethylhexyl)oxy]benz[1,2-b:4,5-b']dithiophene-2,6-diyl][3-fluoro-2-[(2-eth ylhexyl)carbonyl]thieno[3,4-b]thiophenediyl]] (PTB7), PTB7-Th (sometimes referred to as PCE10 or PBDTTT-EFT) which introduces a thienyl group having an electron donating property weaker than an alkoxy group of PTB7, or the like is also preferred.

As the material of the hole transport layer, the metal oxide can also be used. Preferred examples of the metal oxide include a single oxide such as titanium oxide, molybdenum oxide, vanadium oxide, zinc oxide, nickel oxide, lithium oxide, calcium oxide, cesium oxide, magnesium oxide, or aluminum oxide or a mixture thereof. These materials have an advantage of a low price. Moreover, as the material of the hole transport layer, thiocyanate such as copper thiocyanate may be used.

Further, a dopant can be used for a transport material of spiro-OMeTAD or the like and the above-described p-type organic semiconductor. As the dopant, oxygen, 4-tert-butylpyridine, lithium-bis(trifluoromethanesulfonyl)imide(Li-TFSI), acetonitrile, tris[2-(1H-pyrazole-1-yl)pyridine]cobalt (III)tris(hexafluorophosphate)salt (put on the market as a product name "FK102"), tris[2-(1H-pyrazole-1-yl)pyrimidine]cobalt(III)tris[bis(trifluoromethylsulfonyl)imide] (MY11), or the like can be used.

As the hole transport layer, the conductive polymer such as polyethylene dioxythiophene can also be utilized. The one cited in the paragraph regarding the electrode layer can be used as such a conductive polymer. Also in the hole transport layer, another material is combined with a polythiophene-based polymer such as PEDOT, thereby allowing an adjustment to a material having an appropriate work function as the hole transport layer. The work function of the hole transport layer is preferably adjusted so as to become lower than a valence band of an active layer. The electron transport layer and the hole transport layer are formed by, for example, the vacuum deposition method, the sputtering method, the ion plating method, the sol gel method, the coating method, the plating method, or the like.

EXAMPLES

Next, examples and evaluation results thereof will be described.

Examples 1 to 4, Comparative Examples 1 to 3

Production of Photoelectric Conversion Device
After forming an ITO film as a first electrode on a glass substrate, ultrasonic cleaning and UV cleaning were performed in isopropyl alcohol and acetone. A base layer with a thickness of about 50 nm, which contained PEDOT:PSS, was formed on the glass substrate having the ITO film. The PEDOT:PSS layer functions as a hole transport layer. The PEDOT:PSS layer was formed by applying HIL1.1 (product name, made by Heraeus Holding GmbH) at 5000 rpm, thereafter drying it at 140° C. for ten minutes.

Next, a perovskite crystal layer was film-formed as a photoelectric conversion layer as follows. First, a perovskite material solution (coating solution) was prepared by dissolving methylammonium iodide ($CH_3NH_3I$) and lead iodide ($PbI_2$) in N,N-dimethylformamide (DMF). The coating solution was adjusted so that a concentration in the solution became 45 mass % with a molar ratio of methylammonium iodide and lead iodide being 1:1. This coating solution was spin-coated on the glass substrate having the above-described hole transport layer under a condition of 3000 rpm and 25° C. A nitrogen gas was blown during spin coating, thereby drying part of a solvent. After 1.5 hours from the application for perovskite layers, annealing was performed at a temperature of 25° C. in Example 1, at a temperature of 40° C. in Example 2, at a temperature of 70° C. in Example 3, at a temperature of 90° C. in Example 4, at a temperature of 100° C. in Comparative example 1, at a temperature of 130° C. in Comparative example 2, and at a temperature of 150° C. in Comparative example 3. Annealing times at the final temperatures were each set to 15 minutes. Thus, by removing at least part of the solvent in the coating layer and precipitating a perovskite crystal ($CH_3NH_3PbI_3$ crystal), a perovskite compound layer was formed as the photoelectric conversion layer. Note that since an annealing condition of Example 1 was 25° C., a sample left for 1.5 hours after spin-coating the coating solution was used as it was.

Next, a solution in which PCBM was dissolved in dichlorobenzene so that a concentration of PCBM became 20 mg/ml was prepared, and this solution was applied on the formed perovskite compound layer by a spin coating method. Moreover, BCP was deposited thereon by vacuum deposition. These PCBM layer and BCP layer function as an electron transport layer. A second electrode was formed by vacuum depositing Ag on the electron transport layer. Thus, the photoelectric conversion devices in Examples 1 to 4 and Comparative examples 1 to 3 were produced. A power generation area of each of the photoelectric conversion devices was set to 1 $cm^2$.

Measurement of Solvent Volume of Perovskite Compound Layer

Before evaluating a characteristic of the photoelectric conversion devices, a solvent volume in the photoelectric conversion layer (perovskite compound layer) in a formation condition of the perovskite compound layer based on each of the above-described examples was measured as follows. First, the above-described perovskite material solution (coating solution) was applied on the entire surfaces of 24 mm square glass substrates having an ITO film under the above-described conditions, and samples having a glass substrate/ITO film/perovskite compound layer structure were each produced by annealing according to the condition of each of the examples. The solvent (DMF) volume in the perovskite compound layer of each of the samples was measured quantitatively using a gas chromatography mass spectrometry (GC-MS) apparatus.

Figure 3:
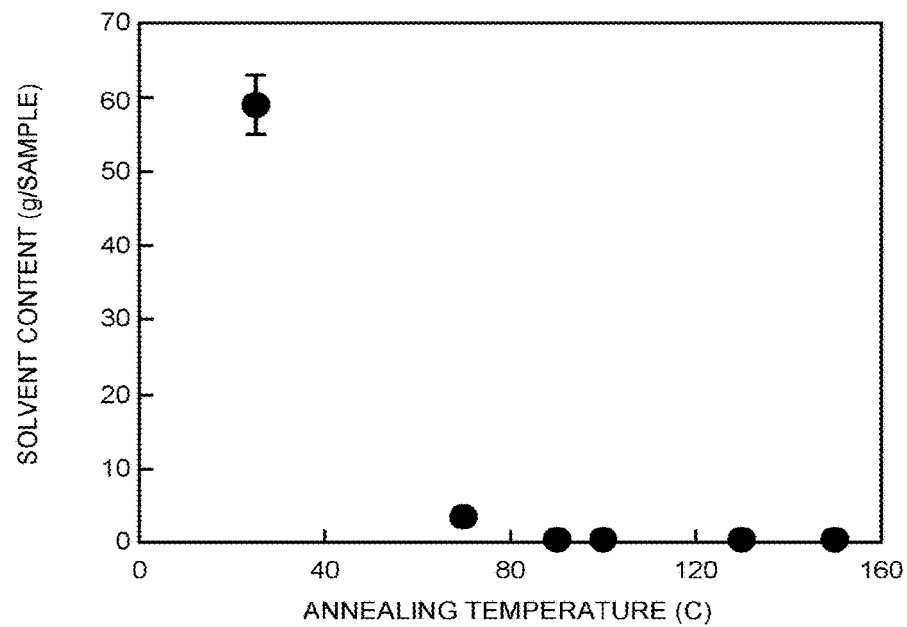
FIG. 3 is a chart representing a relationship between an annealing temperature and a solvent content (μg/sample) of perovskite compound layers in a manufacturing process of a photoelectric conversion device.
Figure 4:
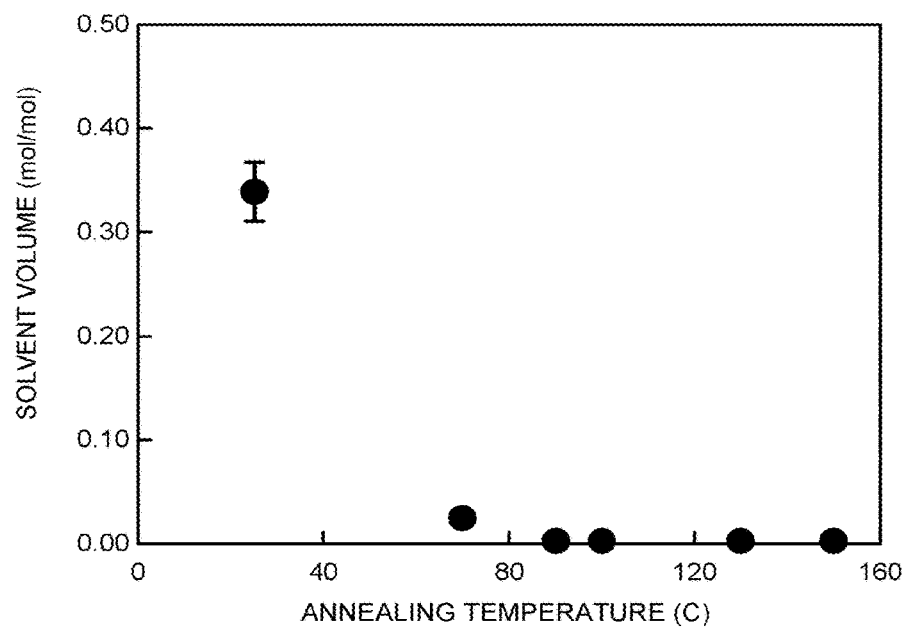
FIG. 4 is a chart representing a relationship between the annealing temperature and a solvent volume (mol/mol) in the perovskite compound layers in the manufacturing process of the photoelectric conversion device.

FIG. 3 and FIG. 4 represent the measurement results. FIG. 3 represents a solvent (DMF) content (unit: μg/sample) of the perovskite compound layers, and FIG. 4 represents the number of molecules (unit: mol/mol) of the solvent (DMF) per one perovskite lattice (1 mol) in the perovskite compound layers. The number of moles of the perovskite lattice was calculated by calculating mass of only perovskite from weights of the perovskite compound layer before and after film formation and dividing the calculated mass by molecular weight (619.98 g/mol) of the perovskite lattice. As a result, the not annealed perovskite compound layer contained 0.34 DMF per one perovskite lattice on average and the perovskite compound layer annealed at 70° C. contained 0.025 DMF on average, on the other hand, the perovskite compound layer annealed at 100° C. contained only 0.0032 DMF on average. It was confirmed that the perovskite compound layers annealed at less than 100° C. and further the perovskite compound layers annealed at low temperatures of 70° C. or less contained much DMF.

Measurement of Film Thickness of Perovskite Compound Layer

Figure 5:
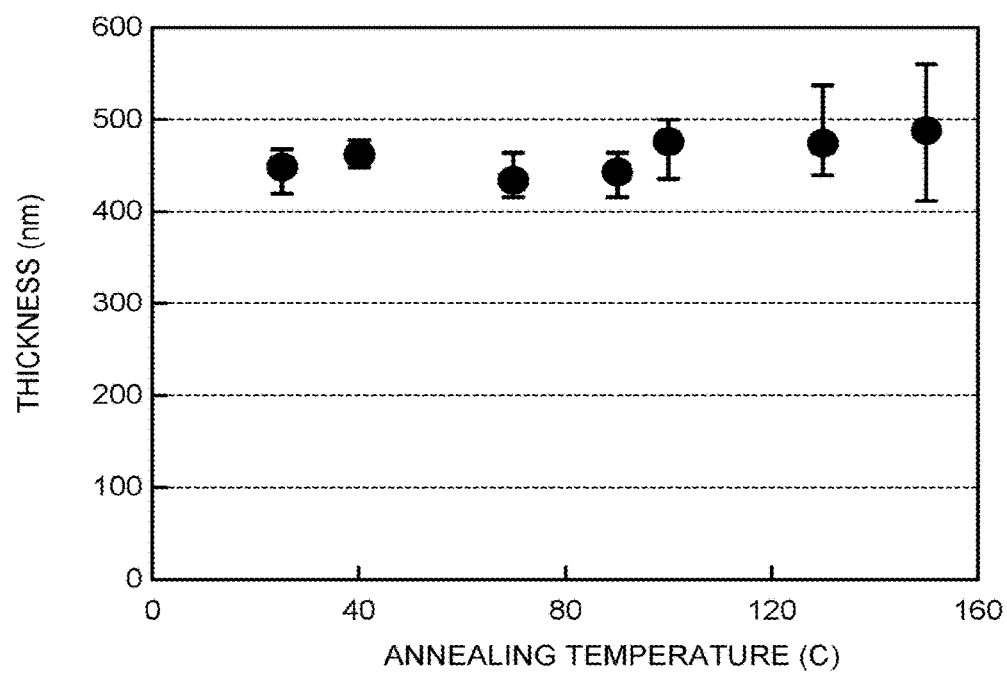
FIG. 5 is a chart representing a relationship between the annealing temperature and a thickness of perovskite compound layers in the manufacturing process of the photoelectric conversion device.

Similarly to the above-described samples for measuring the solvent volume, samples having a glass substrate/ITO film/PEDOT:PSS layer/perovskite compound layer structure were each produced. Thicknesses of the perovskite compound layers were measured using such samples by a thicknessmeter. FIG. 5 represents the result. There was little difference in average thickness among perovskite layers with respect to the annealing temperature, and any of the average thicknesses was about 440 to 490 nm. However, as the annealing temperature rose to 100° C. or more, variations in the thicknesses increased.

Observation and Measurement of Crystal Grain of Perovskite Compound Layer

Figure 6:
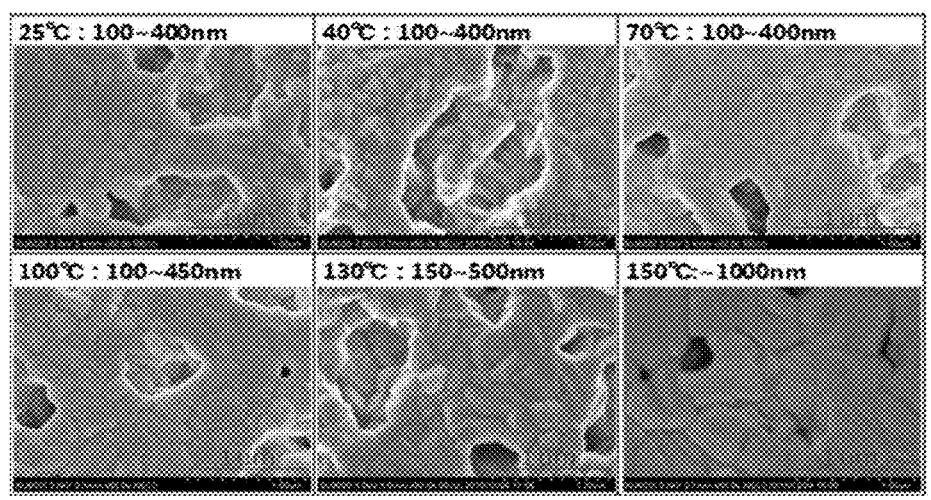
FIG. 6 is a view illustrating SEM images of perovskite compound layer surfaces of samples in which the annealing temperature is changed in the manufacturing process of the photoelectric conversion device.

In the samples having the glass substrate/ITO film/PEDOT:PSS layer/perovskite compound layer structure, a surface state of the perovskite compound layers was observed by a scanning electron microscope (Scanning Electron Microscope: SEM). FIG. 6 illustrates SEM images of the respective samples as the observation results. In the samples annealed at temperatures of 100° C. or more, as the temperature rose, grain diameters of perovskite crystal grains became large, and large particles whose major axis diameter was about 1 μm were observed mainly in the sample annealed at 150° C. In any of the samples annealed at less than 100° C. including the sample (25° C.) which was not actively annealed, perovskite particles having a major axis diameter whose size was about 100 to 400 nm were observed. Any of the average major axis diameters of the perovskite particles of such samples was 300 nm or less.

XRD Measurement of Perovskite Compound Layer

Figure 7:
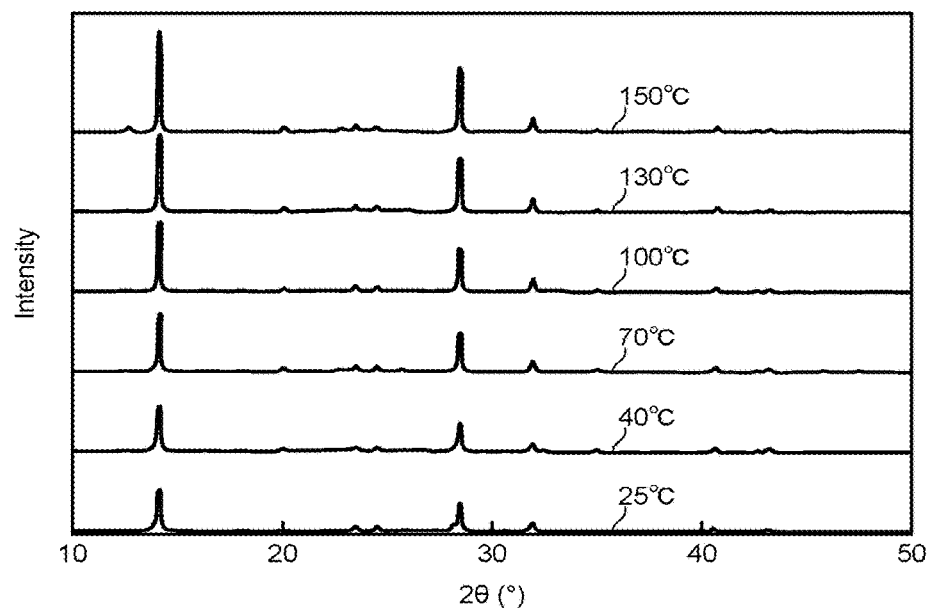
FIG. 7 is a chart representing XRD patterns of the perovskite compound layers of the samples in which the annealing temperature is changed in the manufacturing process of the photoelectric conversion device.
Figure 8:
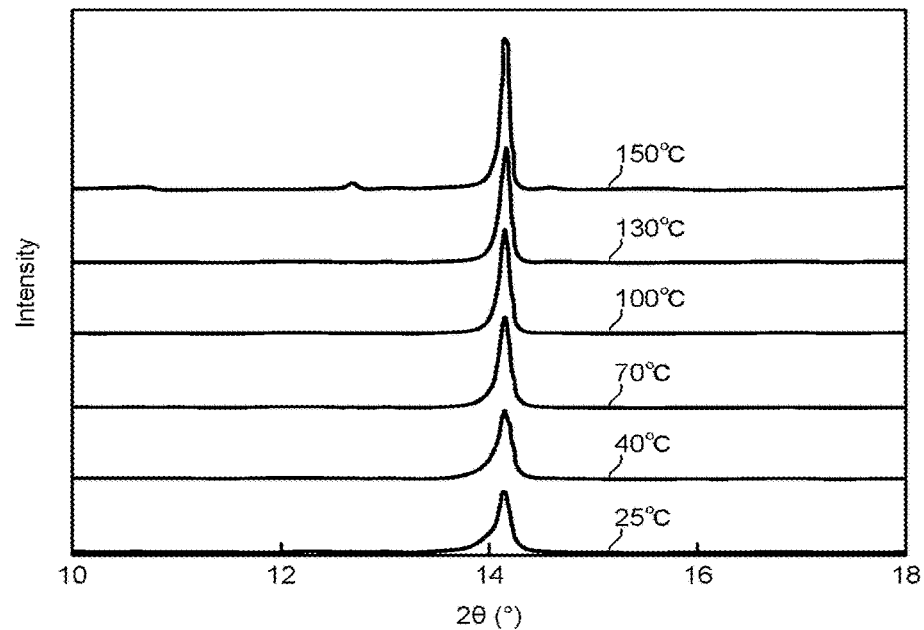
FIG. 8 is a chart representing the XRD patterns of the perovskite compound layers of the samples in which the annealing temperature is changed in the manufacturing process of the photoelectric conversion device.
Figure 9:
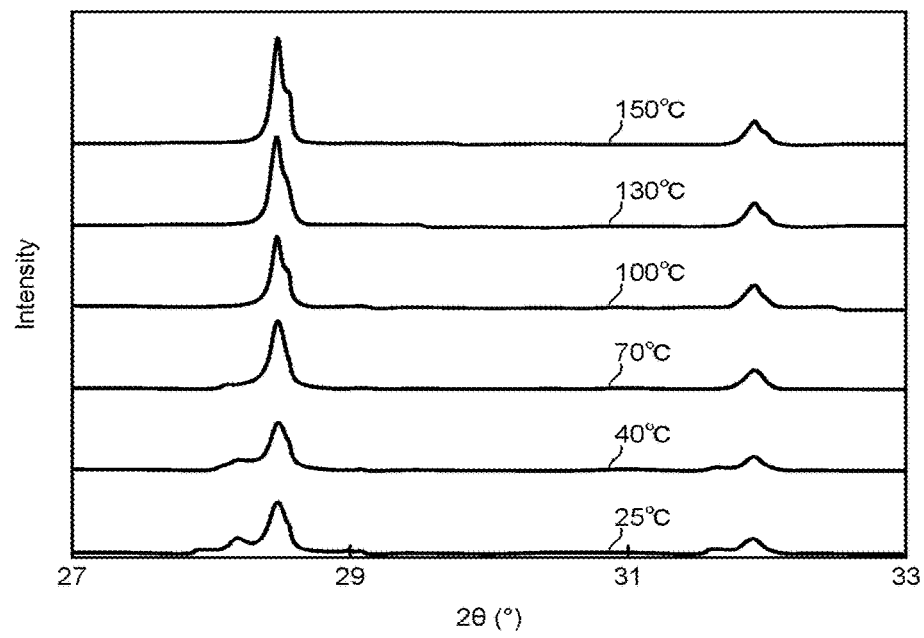
FIG. 9 is a chart representing the XRD patterns of the perovskite compound layers of the samples in which the annealing temperature is changed in the manufacturing process of the photoelectric conversion device.

In the samples having the glass substrate/ITO film/PEDOT:PSS layer/perovskite compound layer structure, FIG. 7, FIG. 8, and FIG. 9 represent results in which an XRD measurement has been carried out. It is found that as the annealing temperature rises, intensity of peaks becomes large and crystallinity becomes high. In the sample annealed at 150° C., a small peak derived from $PbI_2$ appeared near 12.7°. From the samples annealed at 70° C. or less, new peaks not derived from a tetragonal perovskite crystal were seen near 9.5°. From the samples annealed at 40° C. or less, shoulder peaks were seen on lower angle sides than (110) surface peaks of 14.1° (near 14°), and peaks derived from (004) surfaces were also seen near 28.1°. It is considered that the reason why such new peaks are seen from the perovskite compound layers annealed at low temperatures is because DMF which is the solvent of the coating solution forms a new crystal structure with the perovskite crystal, or a distance between atoms constituting the perovskite crystal changes due to DMF, thereby causing distortion of the crystal.

Characteristic Evaluation of Photoelectric Conversion Device

Figure 10:
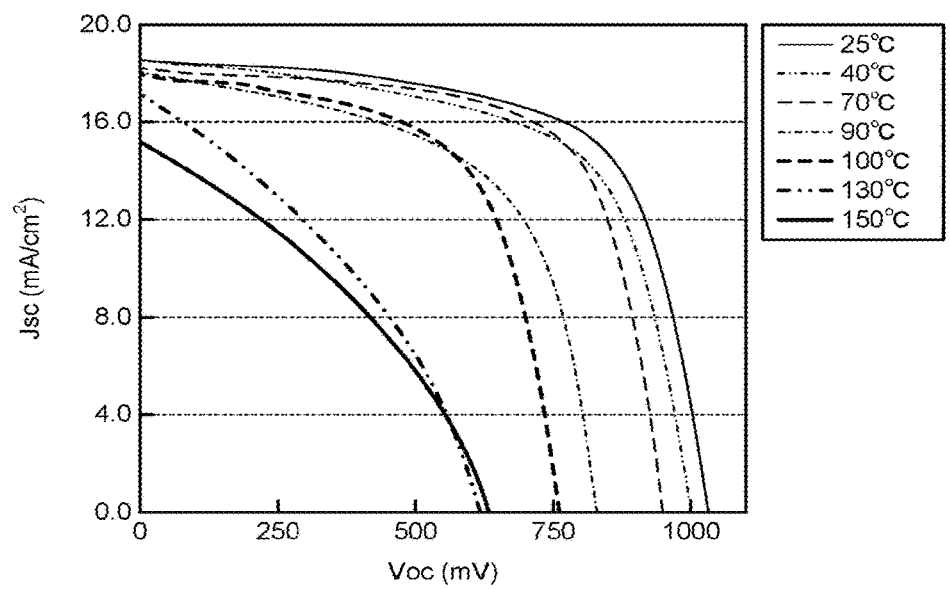
FIG. 10 is a chart representing I-V characteristics of photoelectric conversion devices produced by changing the annealing temperature in the manufacturing process of the photoelectric conversion device.
Figure 11:
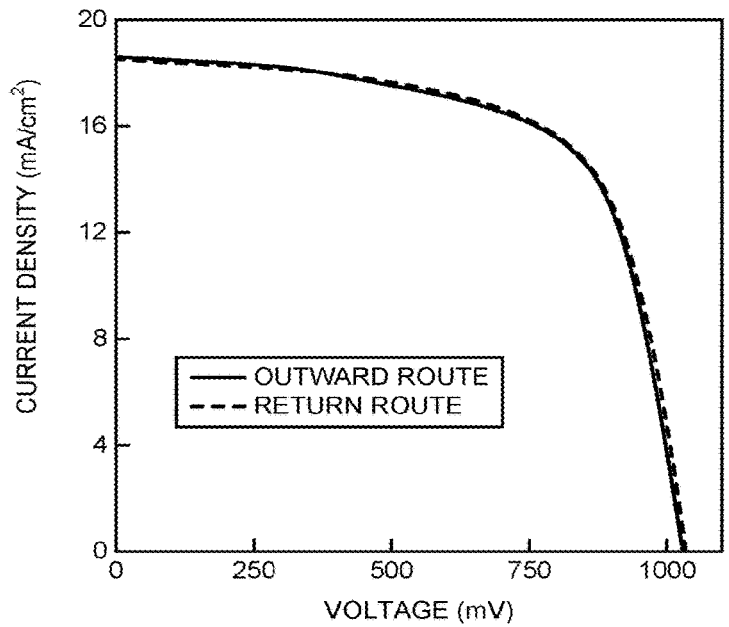
FIG. 11 is a chart representing a round trip I-V characteristic of the photoelectric conversion device in which the annealing temperature is set to 25° C. in the manufacturing process of the photoelectric conversion device.

Regarding the above-described photoelectric conversion devices (photovoltaics) having a glass substrate/ITO film/PEDOT:PSS layer/perovskite compound layer/PCBM layer/BCP layer/Ag film/structure, each I-V characteristic was measured. The measurement of the I-V characteristic was performed by a reference spectrum with irradiance of 100 mW/cm² and air mass (AM) of 1.5 G using a solar simulator. FIG. 10, FIG. 11, and Table 1 represent the measurement results. FIG. 10 represents I-V curves of the respective devices in which the annealing temperatures are different at a time of forming the perovskite compound layers, and FIG. 11 represents round-trip curves of the device in which the annealing temperature is set to 25° C. at a time of forming the perovskite compound layer.

TABLE 1

|  | Exam. 1 | Exam. 2 | Exam. 3 | Exam. 4 | Comp. Exam. 1 | Comp. Exam. 2 | Comp. Exam. 3 |
| --- | --- | --- | --- | --- | --- | --- | --- |
| Solvent (mol)/Perovskite (mol) | 0.345 | 0.118 | 0.025 | 0.0042 | 0.0032 | 0.0030 | 0.0026 |
| Open-Circuit Voltage Voc [mv] | 1031 | 1001 | 950 | 831 | 758 | 616 | 634 |
| Short-Circuit Current Density Jsc [mA/cm²] | 18.5 | 18.5 | 18.2 | 18.0 | 17.9 | 17.2 | 15.2 |
| Peak Power Pmax [mw] | 12.54 | 11.71 | 11.65 | 8.67 | 8.40 | 3.80 | 3.37 |
| Fill Factor FF | 0.66 | 0.63 | 0.68 | 0.58 | 0.62 | 0.36 | 0.35 |
| Conversion Efficiency η [%] | 12.54 | 11.71 | 11.65 | 8.67 | 8.40 | 3.80 | 3.37 |
| Parallel Resistance Rsh [Ω] | 738 | 399 | 743 | 248 | 426 | 63 | 74 |
| Series Resistance Rs [Ω] | 8 | 9 | 6 | 7 | 8 | 15 | 22 |

Figure 12:
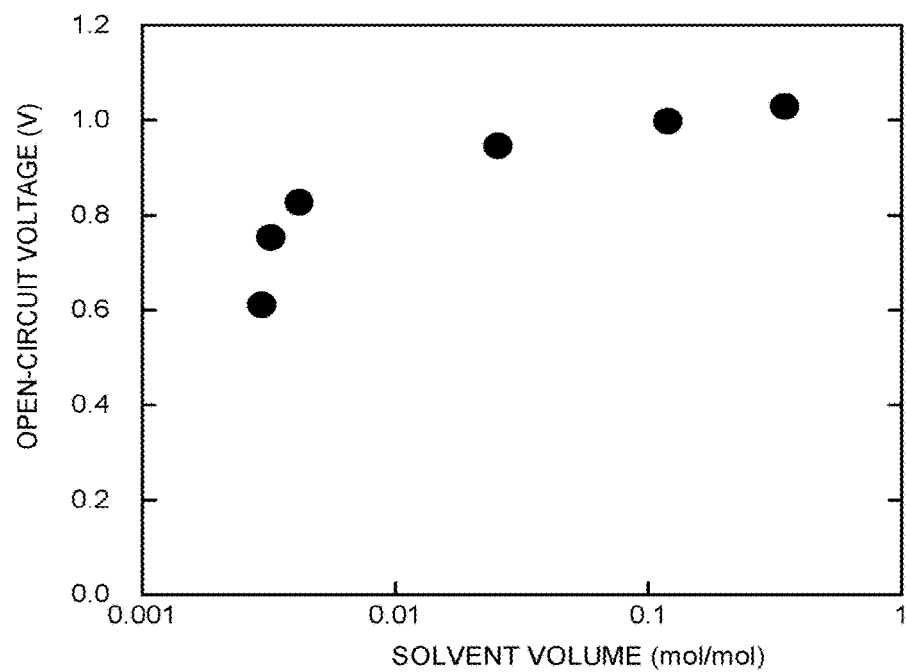
FIG. 12 is a chart representing a relationship between a solvent volume of perovskite compound layers and an open-circuit voltage of the photoelectric conversion devices.
Figure 13:
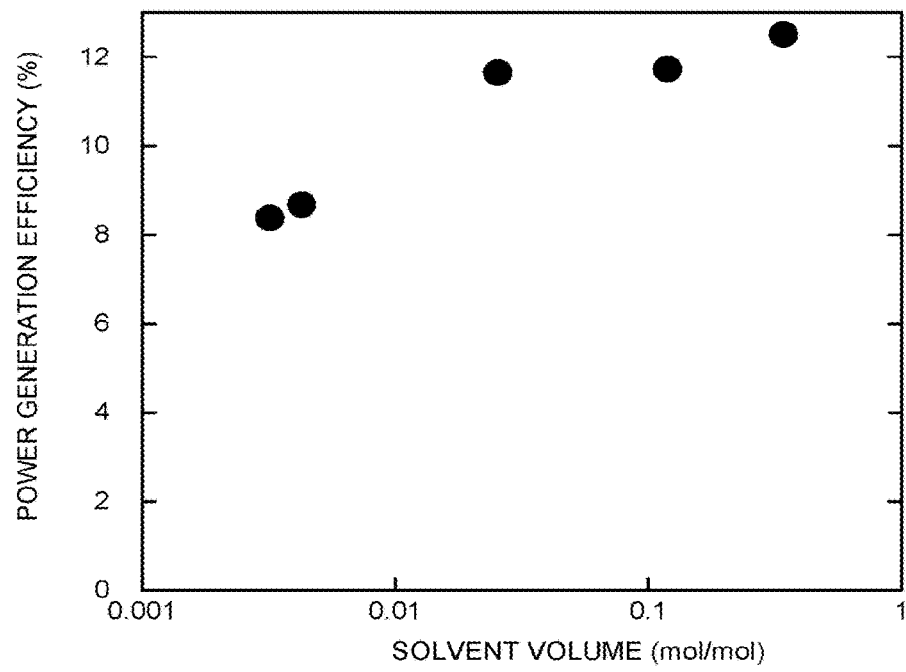
FIG. 13 is a chart representing a relationship between the solvent volume of the perovskite compound layers and power conversion efficiency of the photoelectric conversion devices.

As represented in Table 1, the lower the annealing temperature was, the higher a short-circuit current density (Jsc), an open-circuit voltage (Voc), and conversion efficiency (i) of perovskite photovoltaics were. Moreover, a not annealed photovoltaics (dried at 25° C.) exhibited a high Voc of over 1.0 V and the highest conversion efficiency of 12.54%. Further, FIG. 12 and FIG. 13 represent results in which the open-circuit voltage and the conversion efficiency of the photoelectric conversion devices (perovskite photovoltaics) are plotted with respect to the number of molecules (mol/mol) of the solvent (DMF) per one perovskite lattice. A result on the perovskite photovoltaics annealed at 150° C., whose perovskite compound is confirmed to be decomposed, is excepted. It is found that the larger the number of molecules (solvent volume) of the solvent (DMF) in the perovskite compound layer is, the higher open-circuit voltage and conversion efficiency are exhibited, and the photovoltaics having the solvent volume of 0.004 mol/mol or more exhibit excellent open-circuit voltage and conversion efficiency. Moreover, it is found that the photovoltaics having the solvent volume of 0.02 mol/mol or more exhibit more excellent open-circuit voltage and conversion efficiency.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A photoelectric conversion device comprising, in sequence:
   a substrate;
   a first electrode;
   a photoelectric conversion layer containing a perovskite compound and a solvent enabling dissolution of a crystal of the perovskite compound and a precursor thereof; and
   a second electrode,
   wherein the perovskite compound has a composition represented by the following composition formula:

$ABX_3$, wherein A is at least one selected from the group consisting of a monovalent cation of a metal element and a monovalent cation of an amine compound, B is a bivalent cation of a metal element, and X is a monovalent anion of a halogen element,
   wherein the number of molecules of the solvent existing in the photoelectric conversion layer with respect to one crystal lattice of the perovskite compound is from 0.004 to 0.5.

2. The photoelectric conversion device according to claim 1, wherein A is at least one monovalent cation selected from the group consisting of $Cs^+$, $Rb^+$, $K^+$, $CH_3NH_3^+$, $C_2H_5NH_3^+$, $C_3H_7NH_3^+$, $C_4H_9NH_3^+$, $HC(NH_2)_2^+$, and $C(NH_2)_3^+$, B is at least one divalent cation selected from the group consisting of $Pb^{2+}$, $Sn^{2+}$, and $Ge^{2+}$, and X is at least one monovalent anion selected from the group consisting of $F^-$, $Cl^-$ $Br^-$, and $I^-$.

3. The photoelectric conversion device according to claim 1, wherein the solvent comprises at least one selected from the group consisting of an ester-based solvent, a ketone-based solvent, an ether-based solvent, an alcohol-based solvent having four or more carbons, a halogenated alcohol-based solvent, a glycol ether-based solvent, an amide-based solvent, a nitrile-based solvent, a carbonate-based solvent, a sulfoxide-based solvent, and a halogenated hydrocarbon.

4. The photoelectric conversion device according to claim 1, wherein the solvent comprises an amide-based solvent having an amide structure represented by the following formula:

R1-C(=O)—NR2R3, wherein each of the R1, R2, and R3 independently is a monovalent group selected from the group consisting of hydrogen, halogen, a nitro group, a cyano group, an amino group, a substituted or unsubstituted alkyl group, a substituted or unsubstituted alkoxy group, a substituted or unsubstituted alkanoyl group, a substituted or unsubstituted aryl group, and a substituted or unsubstituted heteroaryl group.

5. The photoelectric conversion device according to claim 1, wherein the perovskite compound has shapes of particles which average major axis diameter is 300 nm or less.

6. The photoelectric conversion device according to claim 1, wherein the perovskite compound in the photoelectric conversion layer has an X-ray diffraction pattern having a peak approximately 9.5°.

7. The photoelectric conversion device according to claim 1, wherein the perovskite compound in the photoelectric conversion layer has an X-ray diffraction pattern having a peak and a shoulder peak, wherein the peak is positioned approximately 14° and corresponds to a perovskite crystal, wherein the shoulder peak is positioned on a low angle side of the peak.

8. The photoelectric conversion device according to claim 1, wherein the number of molecules of the solvent existing in the photoelectric conversion layer with respect to one crystal lattice of the perovskite compound ranges from 0.02 to 0.5.

9. The photoelectric conversion device according to claim 1, wherein the photoelectric conversion layer further comprises, as an additive, at least one selected from the group consisting of a surfactant, a charge impairing agent, 1,8-diiodooctane, and N-cyclohexyl-2-pyrrolidone.

10. The photoelectric conversion device according to claim 1, wherein a solubility of the crystal of the perovskite compound and the precursor thereof in the solvent at 25° C. is 15 g/100 g or more.

* * * * *